(12) United States Patent
Goodman et al.

(10) Patent No.: US 8,410,843 B2
(45) Date of Patent: Apr. 2, 2013

(54) POLYPHASE NONLINEAR DIGITAL PREDISTORTION

(75) Inventors: Joel I. Goodman, Chelmsford, MA (US); Benjamin A. Miller, Cambridge, MA (US); Matthew A. Herman, Boston, MA (US); James E. Vian, Westford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 107 days.

(21) Appl. No.: 12/987,227

(22) Filed: Jan. 10, 2011

(65) Prior Publication Data

US 2012/0176190 A1 Jul. 12, 2012

(51) Int. Cl.
*H03K 5/00* (2006.01)
*H03F 1/26* (2006.01)
(52) U.S. Cl. .................................. 327/551; 330/149
(58) Field of Classification Search .................. 330/149, 330/291, 278; 327/551–559
See application file for complete search history.

(56) References Cited

U.S. PATENT DOCUMENTS

| | | | | |
|---|---|---|---|---|
| 7,098,734 | B2 * | 8/2006 | Hongo et al. | 330/149 |
| 7,149,257 | B2 * | 12/2006 | Braithwaite | 375/296 |
| 7,170,344 | B2 * | 1/2007 | Suzuki et al. | 330/149 |
| 7,190,222 | B2 * | 3/2007 | Okazaki et al. | 330/149 |
| 7,808,315 | B2 | 10/2010 | Goodman et al. | |
| 7,848,717 | B2 * | 12/2010 | Liu | 455/114.3 |
| 2001/0035994 | A1 | 11/2001 | Agazzi et al. | |

OTHER PUBLICATIONS

Crochiere, Ronald E. and Rabiner, Lawrence R., *Multirate Digital signal Processing*, 1983, Pretice Hall, pp. 127-192.

Divi, V. and Wornell, G., "Signal recovery in time-interleaved analog-to-digital converters," *Proc. IEEE ICASSP*, pp. 593-596, 2004.
Goodman, J. et al. "Extending the dynamic range of RF receivers using nonlinear equalization," *Waveform Diversity and Design Conference*, 2009 International. 2009. 224-228. © 2009 Institute of Electrical and Electronics Engineers.
Goodman, J. et al. "Polyphase Nonlinear Equalization of Time-Interleaved Analog-to-Digital Converters," *Selected Topics in Signed Processing, IEEE Journal of 3.3* (2009): 362-373. © 2009 Institute of Electrical and Electronic Engineers.
Vogel, C., "Time-interleaved analog-to-digital converters: Status and future directions," *2006 IEEE International Symposium on circuits and systems*, p. 4, 2006.
Herman, M. et al., "The Cube Coefficient Subspace Architecture for Nonlinear Digital Predisposition," *42nd Asilomar Conference on Signals*, Oct. 26, 2008, pp. 1857-1861, XP007909221.
Goodman, J. et al. "A new approach to achieving high performance power amplifier linearization," *2007 IEEE Radar Conference* (Apr. 2007), 2007, pp. 840-845.
International Search Report and Written Opinion of PCT/US2011/066768 dated Apr. 12, 2012.
Amirkhany, A., et al "Time-Variant Characterization and Compensation of Wideband Circuits" Custom Integrated Circuits Conference, IEEE, Sep. 16, 2007.

(Continued)

*Primary Examiner* — Dinh T. Le
(74) *Attorney, Agent, or Firm* — Cesari and McKenna, LLP

(57) ABSTRACT

Polyphase nonlinear digital predistorters (pNDPs) mitigate nonlinear distortions generated by time-interleaved digital-to-analog converters (TIDACs). Processors in an example pNDP compute nonlinear and linear compensation terms representative of channel mismatches and other imperfections in the TIDAC based on the digital input to the TIDAC. The pNDP subtracts these compensation terms from a delayed copy of the digital input to yield a predistorted digital input. The TIDAC converts on the predistorted digital input into a fullband analog output that is substantially free of nonlinear distortion.

24 Claims, 5 Drawing Sheets

OTHER PUBLICATIONS

Vogel, C., et al "Compensation of Distortions Caused by Periodic Nonuniform Holding Signals" Communications Systems, Networks and Digital Signal Processing, IEEE, Jul. 25, 2008.

Texas Instruments Incorporated "16-Bit 1.0 GSPS 2x-4x Interpolating Dual-Channel Digital-to-Analog Converter" Mar. 27, 2012.

Yang, X., et al. "Poly-Harmonic Modeling and Predistortion Linearization for Software-Defined Radio Upconverters"; Transactions of Microwave Theory and Techniques, 58:8, pp. 2125-2133, Aug. 1, 2010.

* cited by examiner

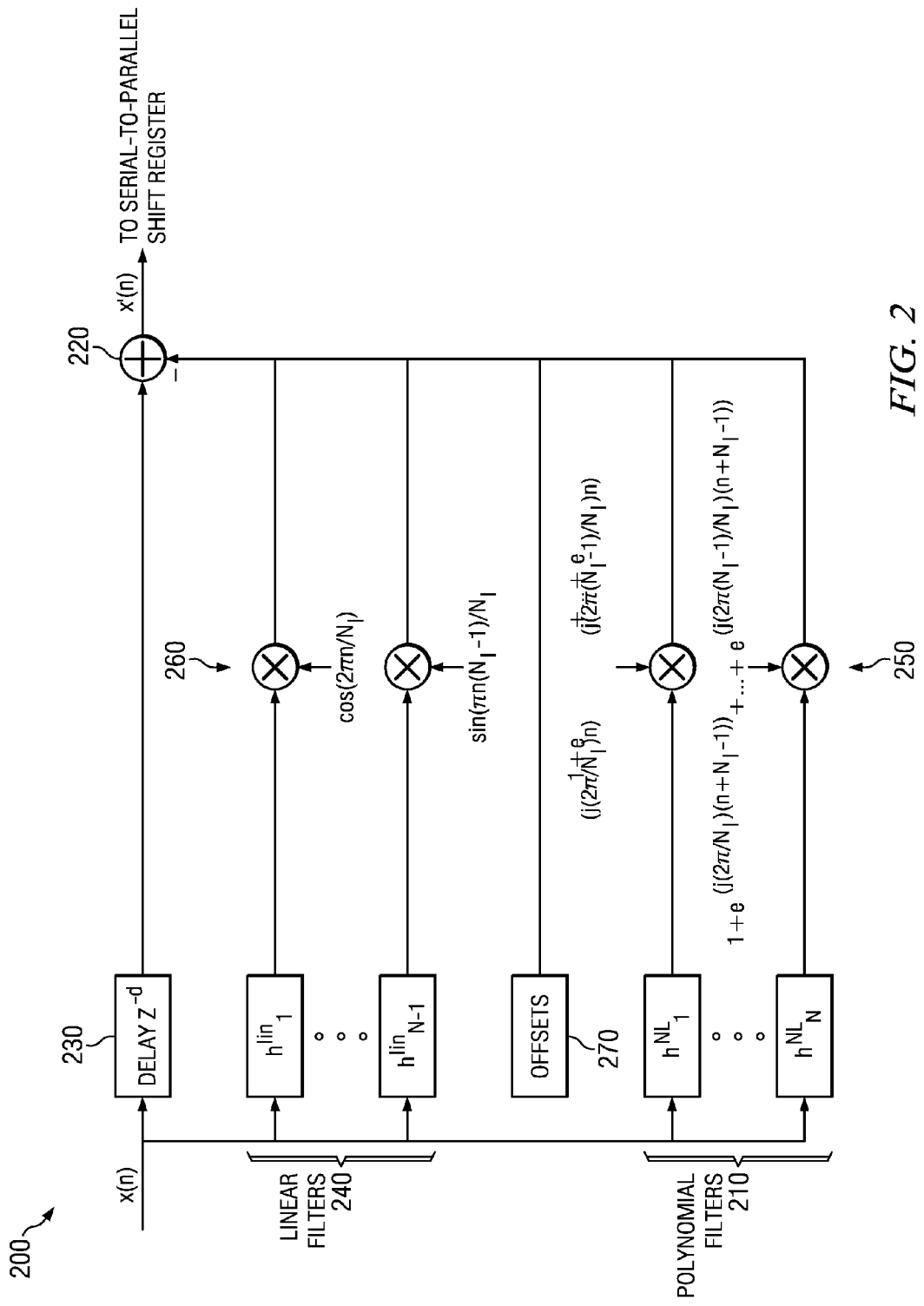

POLYPHASE NONLINEAR DIGITAL PREDISTORTION

GOVERNMENT SUPPORT

This invention was made with government support under Contract No. FA8721-09-C-0002 from the Defense Advanced Research Projects Agency. The government has certain rights in the invention.

BACKGROUND

A time-interleaved digital-to-analog converter (TIDAC) uses N digital-to-analog converters (DAC) to produce an analog output signal whose aggregate bandwidth is N times greater than the output signal bandwidth of any DAC operating in isolation. In a typical TIDAC, a serial-to-parallel converter couples a digital signal x(n) with a bandwidth B into the DACs, which are arranged in parallel. Each DAC samples and holds the digital signal at a rate N/B, producing an analog voltage or current. A clock coupled to the DACs causes the DACs to operate on the digital signal at intervals staggered by a period T=1/B, such that the first DAC samples the digital signal at t=0, the second DAC samples the digital signal at t=1/B, and so on. A combiner coupled to the outputs of the DACs interleaves the outputs from the DACs to produce the fullband analog output.

Unfortunately, nonlinearities in the TIDAC introduce distortion into the fullband analog output. These nonlinearities include mismatches in gain, phase, and/or offset (bias level) between different DACs in the TIDAC as well as nonlinearities of the individual DACs. In some cases, the amount of distortion in the analog output can fluctuate due to environmental perturbations that affect the mismatch(es) between DACs in the TIDAC. At present, there is no way to compensate effectively for such distortions in the analog output of a TIDAC due to the nonlinear responses of DACs in the TIDAC.

SUMMARY

Embodiments of the present invention include an apparatus and a corresponding method of predistorting a digital waveform to compensate for nonlinearities in digital-to-analog converters (DACs), time-interleaved DACs (TIDACs), and other devices. A processor creates a polyphase nonlinear compensation term that represents a nonlinear response of at least one DAC in a TIDAC, and a summer coupled to the processor subtracts the nonlinear compensation term from a copy of the digital waveform to obtain a predistorted digital waveform. Converting the predistorted digital waveform with the TIDAC yields an analog waveform that is substantially free of nonlinear distortion.

In some examples, the processor measures the analog waveform emitted by the TIDAC to determine the level and character of distortion in analog waveform. If the processor senses excessive distortion in the analog waveform, then it may adjust the polyphase nonlinear compensation term accordingly. This is especially useful when the nonlinear response is due to a gain, offset, or phase mismatch between at least one pair of DACs in the TIDAC. A delay block can delay the copy of the digital waveform by a time approximately equal to the time required to create the polyphase nonlinear compensation term before subtracting the polyphase nonlinear compensation term from the copy of the digital waveform. This delay improves the fidelity of the predistortion to the nonlinear response.

Processors can also create a compensation term representative of a linear mismatch between DACs in the TIDAC, and the summer can subtract this compensation term from the copy of the digital waveform. The summer can also subtract offsets from the copy of the digital waveform to compensate for bias errors; in some cases, the summer may subtract different offsets—e.g., one offset per DAC in the TIDAC—in a serial fashion to compensate for different offset mismatches and errors in different DACs in the TIDAC.

The polyphase nonlinear compensation term can be created using a variety techniques as readily appreciated by those skilled in the art. For example, the processor can filter copies of the digital waveform with linear polyphase decimation filters arranged in parallel. A switch interleaves the downsampled outputs of the linear polyphase filters to produce the nonlinear compensation term. If the TIDAC includes N channels, then the processor may include at least N−1 linear polyphase filters. Alternatively, the processor can filter copies of the digital waveform with linear filters, and mix the linear filter outputs with a tone. For higher-order distortions, polynomial filters can be used whose outputs are likewise either downsampled and interleaved or frequency-shifted by a tone. Example processors can be implemented in software and/or hardware as explained below.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 2 is a block diagram of a polyphase nonlinear predistortion processor suitable for use in the receiver of FIG. 1.

DETAILED DESCRIPTION

A description of example embodiments of the invention follows.

Figure 1:
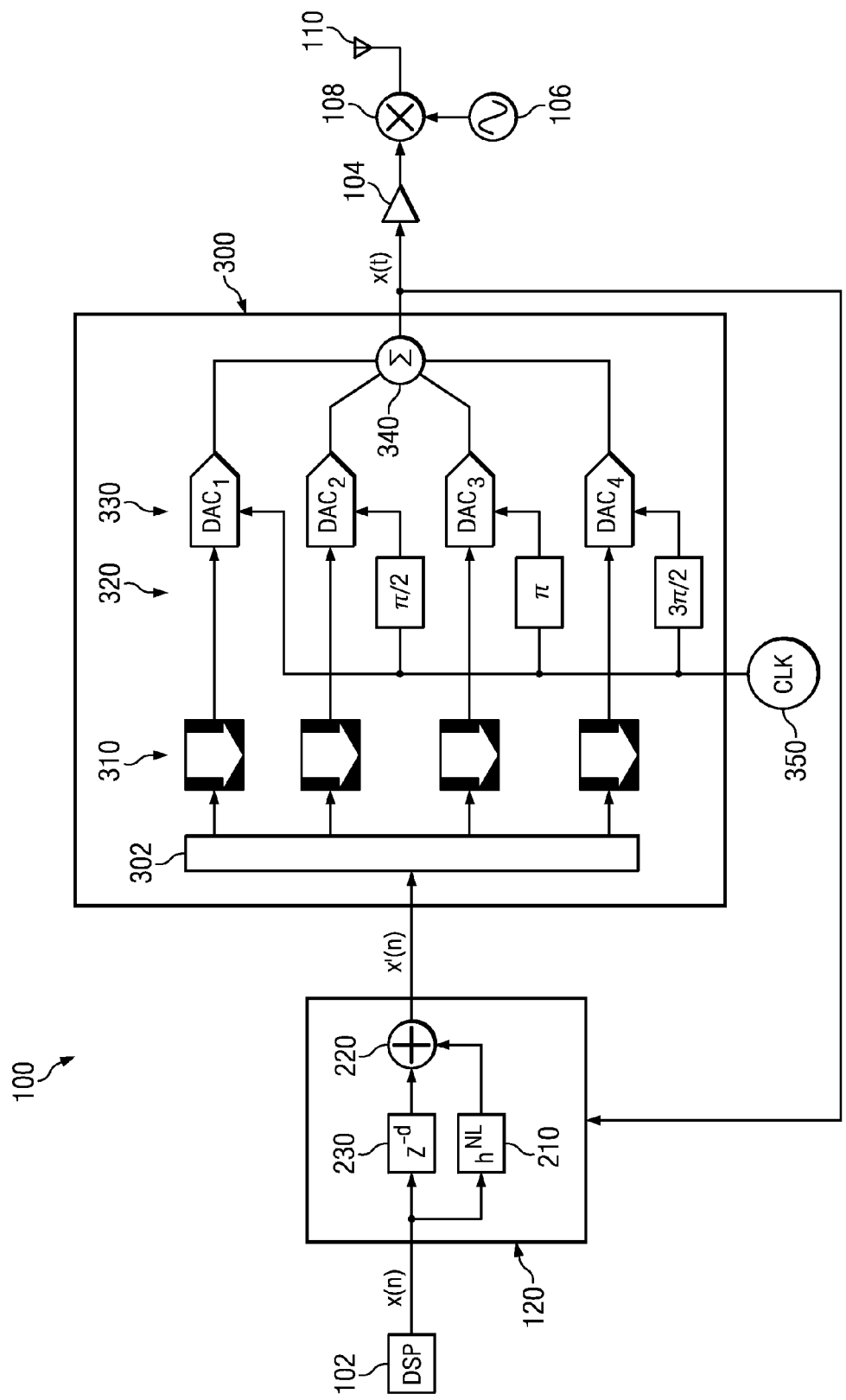
FIG. 1 is a block diagram of a transmitter that includes a polyphase nonlinear predistortion processor to mitigate distortions in a TIDAC.

FIG. 1 shows a transmitter 100 that converts a digital signal x(n) to a broadband analog signal x(t) with a TIDAC 300 and transmits an amplified, up-converted version of the analog signal. A digital signal processor (DSP) 102 or other digital signal source provides the digital signal x(n), which is coupled to the input of a polyphase nonlinear digital predistorter (pNDP) 120 that compensates for nonlinearities in the TIDAC 300. A processor 210 in the pNDP 120 operates on one copy of the digital signal, x(n), to produce a nonlinear compensation term that represents nonlinearities introduced by the TIDAC 300. A summer 220 subtracts (or adds, as appropriate) the nonlinear compensation term from another copy of the digital signal, which is delayed by a delay block 230 to offset the processing time needed to generate the nonlinear compensation term. In this case, the pNDP 120 can be operably coupled to the output of the TIDAC 300 in a feedback loop (not shown) to adaptively compensate for distortion in the analog signal, x(t), emitted by the TIDAC 300.

Alternatively, the pNDP 120 may operate using a priori information about the TIDAC 300, including information derived from training sets or models about the TIDAC 300 and its behavior. For example, a control computer (not shown) coupled to the output of the pNDP 120 may compute an expected TIDAC output based on the pNDP output and a model of the TIDAC behavior for a given digital input. The control computer computes pNDP processor 210 parameters (e.g., the filter coefficients described below) and programs the pNDP processor 210 accordingly. This training process can be repeated periodically or as desired to account for changes in the TIDAC nonlinearities due to environmental perturbations, drift, etc., as understood by those skilled in the art.

The pNDP 120 transmits a predistorted digital signal x'(n) to the TIDAC 300, which distributes the predistorted digital signal among four parallel DAC channels using a serial-to-parallel converter 302. (Although the TIDAC 300 shown in FIG. 1 has only four channels, inventive predistorters can also work with TIDACs with more or fewer channels.) Each channel includes a (notional) decimator 310, which decimates the predistorted digital signal, and a DAC 330 that operates on the decimated output. A clock 350 and a set of phase shifts 320 control the DAC timing such that the DACs 330 operate in a staggered fashion on the decimated filter outputs. Each DAC 330 converts its decimated input into a relatively narrowband analog signal, repeated in frequency over the full bandwidth, which is interleaved with the analog outputs of the other DAC channels using a summer 340, switch, or other device to produce the broadband analog output, x(t).

An optional amplifier 104 boosts the strength of the analog output. An optional mixer 108 mixes the amplified analog output with a local oscillator from an optional synthesizer 106 to produce an up-converted analog signal. An antenna 110 transmits the up-converted signal to one or more broadband wireless receivers, such as the receivers described in U.S. application Ser. No. 12/963,128 filed on Dec. 8, 2010, by Goodman et al., which is incorporated herein by reference in its entirety.

Distortions in TIDACs

Interleaving N output streams in TIDACs creates distortions at frequencies other than the frequencies of the original input signal $X_a(\omega)$ which can be seen in the frequency response of the output, given by:

$$Y(\omega) = \sum_{i=1}^{N} \sum_{k=0}^{N-1} G_i(\omega) X_a\left(\omega - \frac{2\pi k}{N}\right) e^{j2\pi k(i-1)/N}, \quad (1)$$

with $X_a(\omega)=X_a(\omega+2\pi m)$ for any integer m. In Equation (1), $\omega$ is the angular frequency in radians per sample (at the full rate), and $G_i(\omega)$ is the linear frequency response of the $i^{th}$ DAC in the TIDAC, and includes amplitude, phase and delay distortions. It is assumed here that the frequencies beyond $\pi$ are removed by an analog reconstruction filter (not shown) at the output of the TIDAC.

Polynomial distortions associated with each of the DACs are similar to the distortions associated with time-interleaved ADC distortions, and can be modeled in a similar fashion, with the output of a $p^{th}$-order Volterra kernel given by:

$$Y_p(\omega_1, \ldots, \omega_p) = \sum_{i=1}^{N} G_{i,p}(\omega_1, \ldots, \omega_p) \prod_{m=1}^{P} \sum_{k=0}^{N-1} X_a\left(\omega_m - \frac{2\pi k}{N}\right) e^{\frac{j2\pi k(i-1)}{N}}, \quad (2)$$

where $G_{i,p}$ is the frequency-domain representation of the $p^{th}$-order kernel for the $i^{th}$ DAC. For a more thorough treatment of similar distortions in TIADCs, see J. Goodman et al., "Polyphase nonlinear equalization of time interleaved ADCs," IEEE J. Sel. Top. Sig. Proc., 3(3):362-373 (June 2009), which is incorporated herein by reference in its entirety.

FIG. 2 shows an alternative pNDP 200 suitable for mitigating the distortions formulated in Equations (1) and (2). The pNDP 200 includes both linear filters 240 and nonlinear filters 210 that operate on the digital input x(n) to produce a predistorted output x'(n). The nonlinear filters 210 generate a series of nonlinear compensation terms, each of which corresponds to the nonlinear distortion associated with a particular DAC channel or pair of DAC channels in the TIDAC. The individual polynomial filters 240 could be, for example, defined as described below with respect to FIGS. 3A-3B. The filter architecture identification process can be iterative, and can be implemented using the inverse filter method described in J. Goodman et al., "A New Approach to Achieving High-Performance Power Amplifier Linearization," in Technical Program for 2007 IEEE Radar Conference, eds. E. Ferraro and D. K. Barton, pp. 840-845, which is incorporated herein by reference in its entirety.

Digital multipliers 250 coupled to the outputs of the nonlinear filters 210 multiply the nonlinear compensation terms by phase-shifted versions of a repeating digital sequence (e.g., 100010001000 . . . for the first channel, 010001000100 . . . for the second channel, and so on for the TIDAC 300 in FIG. 1). By multiplying the nonlinear compensation terms with the phase-shifted sequences, the multipliers 250 match each nonlinear compensation term to the bits in the digital signal that will be converted by the corresponding DAC channel in the TIDAC.

The linear filters 240 create linear mismatch compensation terms, each of which represents an interleaved distortion due to the mismatch between a pair of adjacent DAC channels in the TIDAC. Digital multipliers 260 shift the linear compensation terms up to the frequencies where the interleaved distortions fall. A summer 220 subtracts the shifted linear compensation terms and the nonlinear compensation terms from a delayed version of the digital input to produce the output. The summer 220 may also subtract a dc offset, which is generated by an offset block 270, to compensate for an overall bias error in the TIDAC.

Example pNDP Architectures pNDPs can be implemented in a variety of ways, e.g., in software or in hardware, such as in application-specific integrated circuits (ASICs), field-programmable gate arrays (FPGAs), stored program digital signal processors (DSPs), etc., and/or in a single device. Example pNDPs can have any of many suitable processor architectures, including the architectures described below with respect to FIGS. 3A and 3B. In general, the choice of processor architecture depends on factors including but not limited to computational efficiency, power consumption, cost, and size.

Figure 3A:
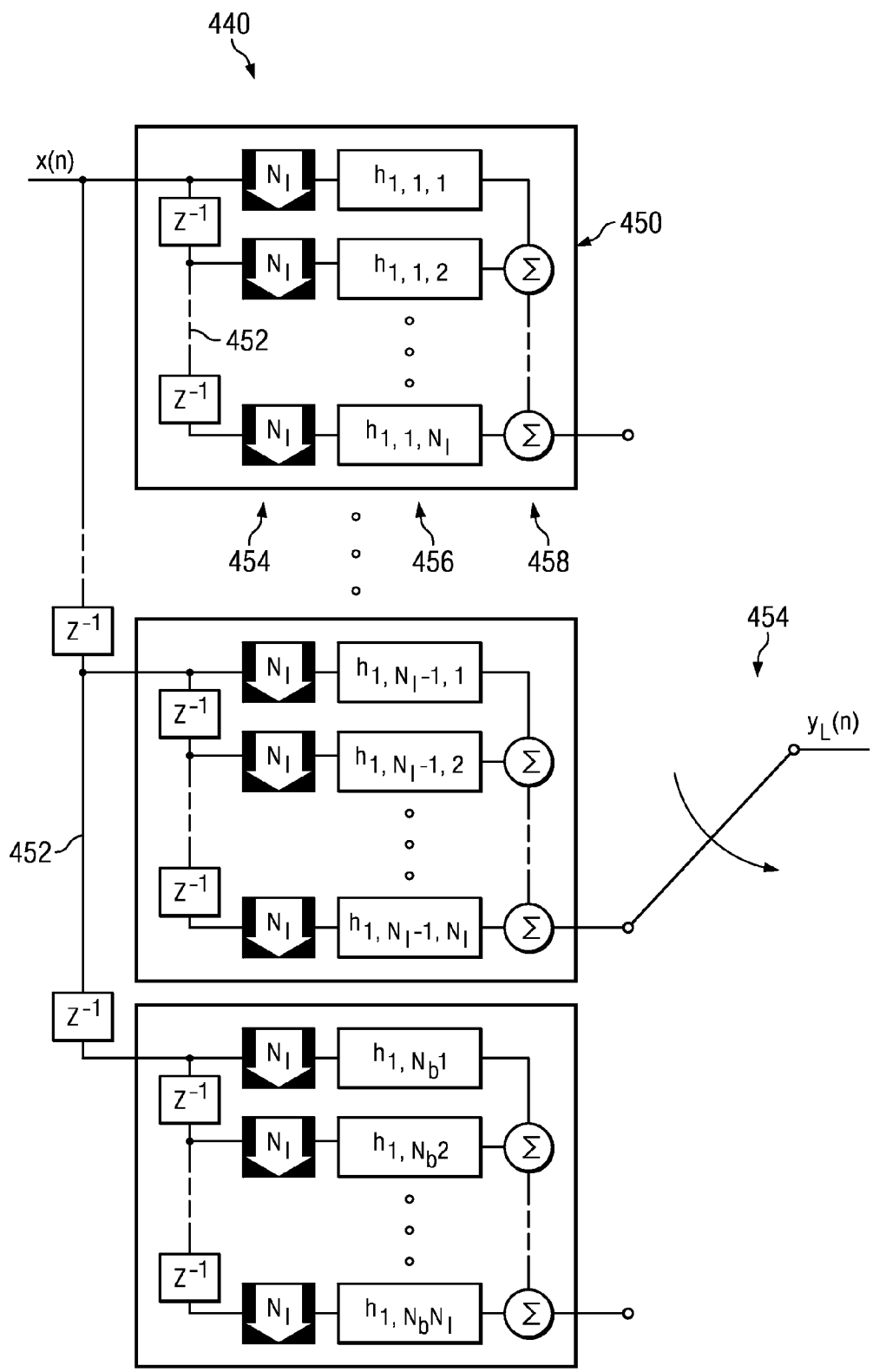
FIGS. 3A and 3B are block diagrams of architectures suitable for a polyphase nonlinear predistortion processor.

FIG. 3A shows an alternative pNDP processor 440 that uses linear polyphase filters 450 coupled in parallel to a tapped delay line 442 to generate linear and nonlinear compensation terms for predistorting the input to an N-channel TIDAC. Each linear polyphase filter 450 includes a tapped delay line 452 that splits the filter's digital input into N copies staggered at delay intervals equal in duration to one sample at the full TIDAC sampling rate (e.g., at $1/f_s$). Downsamplers 454 coupled to the outputs of the tapped delay line 452 decimate the copies of the digital output by a factor of N. Subfilters 456 coupled to the downsamplers 454 operate in parallel on the downsampled outputs of the tapped delay line 452, and their outputs are combined with summers 458. Decimating the outputs of the tapped delay before filtering increases the computational efficiency by reducing the total number of samples filtered by each sub-filter 456.

The alternative processor 440 shown in FIG. 3A includes N linear polyphase filters 450 coupled in parallel to an N-output tapped delay line 442, where the delay between taps is the reciprocal of the TIDAC sampling frequency. Each linear filter 450 produces a reduced-rate output that addresses the distortion for a particular channel in the TIDAC. For example, the first linear polyphase filter compensates for the distortion in the first DAC channel, the second linear polyphase filter compensates for the distortion from the second DAC channel, and so on. A switch 454 interleaves the filter outputs to create a nonlinear compensation term $y_L(n)$ that can be subtracted from a delayed copy of the digital signal, $x(n)$, to form the predistorted digital signal, $x'(n)$.

Figure 3B:
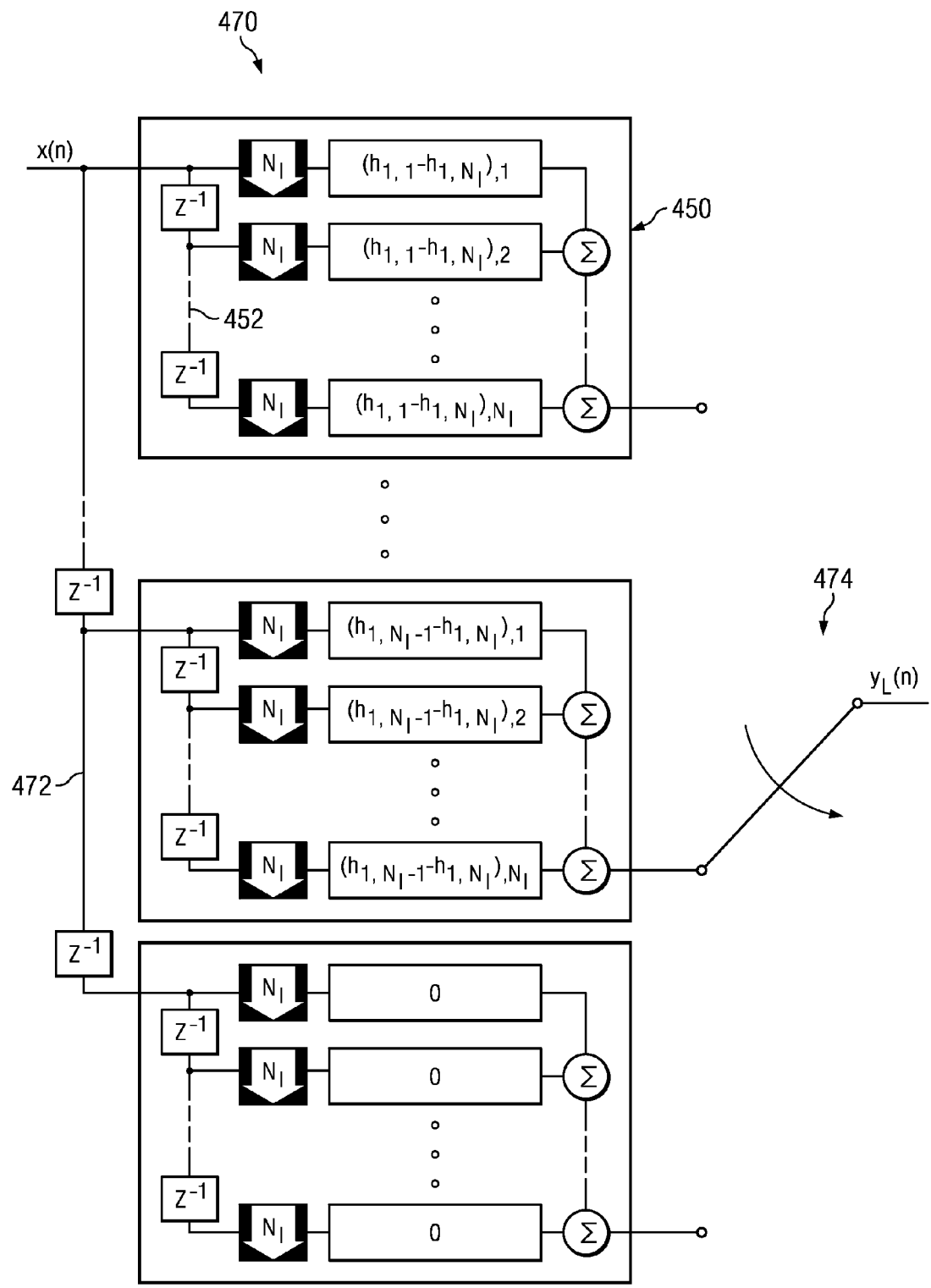

FIG. 3B shows another alternative pNDP processor 470 that compensates for nonlinear distortions (e.g., due to linear mismatches) with N−1 linear polyphase filters 450 coupled in parallel to a tapped delay line 472 with N−1 outputs. As above, the delay between taps in the tapped delay line 472 is the reciprocal of the TIDAC sampling frequency. Again, each filter 450 operates on the output of a particular DAC channel in the TIDAC, and a switch 474 interleaves the filter outputs to create a nonlinear compensation term $y_L(n)$ that can be subtracted from a delayed copy of the digital signal, $x(n)$, to form the predistorted digital signal, $x'(n)$. In this case the mismatches between the filters are the same, so the nonlinear compensation term is the same. For more on the alternative polyphase processors shown in FIGS. 3A and 3B, see B. Miller et al., "A Polyphase Nonlinear Equalization Architecture and Semi-blind Identification method," in Proceedings of the 42nd Asilomar Conference on Signals, Systems and Computers (Oct. 26-29, 2008).

One unique aspect of polyphase nonlinear predistortion is that it simultaneously suppresses not only frequency-dependent linear mismatch distortions in TIDACs, but also polynomial distortions and polynomial mismatch distortions in a computationally efficient fashion. Existing approaches to achieving computationally efficient polynomial filter architectures for radio-frequency compensation, principally developed to mitigate distortions generated by power amplifiers in transmitters, limit the multidimensional signal space over which the architecture can suppress spectral regrowth and in-band spurs. In contrast, the processors shown in FIGS. 2 and 3A-3B search over an unrestricted multidimensional signal space to select polynomial components that yield the highest equalization performance for a given computational complexity, as described in U.S. Pat. No. 7,808,315 to Goodman et al., incorporated herein by reference in its entirety.

To see how the pNDP 200 operates, consider the case in which the nonlinear distortions occur entirely due to mismatches in the linear responses of the TIDAC's constituent DACs. Let the linear frequency response of the $i^{th}$ DAC be $G_i(\omega)$. Each DAC channel includes a linear filter that operates on data at the full sampling rate $f_s$, but outputs data at $f_s/N$ (i.e., the linear filter in the DAC channel downsamples the data, as in FIG. 3A). Let the frequency response of this filter be $H_i(\omega)$ and the input to the system be $X(\omega)$. The output of the filter $X(\omega) H_i(\omega)$ is thus decimated by N, resulting in $$Y_i(\omega) = \sum_{k=0}^{N-1} X\left(\omega - \frac{2\pi k}{N}\right) H_i\left(\omega - \frac{2\pi k}{N}\right) \exp\left(-\frac{2\pi k}{N}\right). \quad (3)$$

where $X(\omega)=X(\omega+2\pi m)$ for any integer m. The DAC operates on the filter output, which can be represented as the multiplication of $Y_i(\omega)$ with $G_i(\omega)$, and the outputs of all DACs are summed, resulting in:

$$Z(\omega) = \sum_{i=1}^{N} Y_i(\omega) G_i(\omega).$$

Expanding the expressions for the frequency responses of the filter and the DAC yields:

$$Z(\omega) = \sum_{i=1}^{N} \sum_{k=0}^{N-1} G_i(\omega) X\left(\omega - \frac{2\pi k}{N}\right) H_i\left(\omega - \frac{2\pi k}{N}\right) \exp\left(-\frac{2\pi k}{N}\right). \quad (4)$$

Since the desired output is $Z(\omega)=X(\omega)$, knowing the frequency responses of the DACs makes it possible to solve the system of equations:

$$1 = \sum_{i=1}^{N} G_i(\omega) H_i(\omega) \quad (5a)$$

$$\sum_{i=1}^{N} \exp(-j2\pi k/N) G_i(\omega) H_i(\omega - 2\pi k/N) = 0, \quad 1 \leq k < N \quad (5b)$$

for all $H_i(\omega)$. The solution to Equations (5a) and (5b) can be used to invert the mismatches that cause the dominant nonlinear distortions in the TIDAC.

Suppose that there is a nonlinear impulse response for each DAC. Let the nonlinear output of each constituent DAC be expressed by a Volterra series, with the $p^{th}$-order kernel for $i^{th}$ DAC given by $g_{p,i}(m_1, \ldots, m_p)$. For an input $x(n)$ to the TIDAC, the nonlinear output of the DAC is:

$$y_i(n) = \sum_{p=2}^{P} \sum_{m_1=0}^{M} \ldots \sum_{m_p=1}^{M} g_{p,i}(m_1, \ldots, m_p) \prod_{l=1}^{p} x_i(n - m_l). \quad (6)$$

where $x_i(n)$ represents the input to the $i^{th}$ DAC.

If $n \equiv i-1 \pmod{N}$, the input to the $i^{th}$ DAC equals the overall input, $x_i(n)=x(n)$. Otherwise, the input to the $i^{th}$ DAC is zero, since each DAC in the TIDAC receives (and transmits) a decimated version of the waveform. This means that the product $\pi_{l=1}^{P} x_i(n-m_l)$ will only be nonzero when all $m_l$ are equivalent mod N. This makes it possible to break each kernel in Equation (6) into N kernels and rewrite the equation as follows:

$$y_i\left(\left\lfloor \frac{n}{N} \right\rfloor N + k\right) = \sum_{p=2}^{P} \sum_{m_1=1}^{\left\lceil \frac{M}{N} \right\rceil} \ldots$$

$$\sum_{m_p=1}^{\left\lceil \frac{M}{N} \right\rceil} g_{p,i,k}(m_1, \ldots, m_p) \prod_{l=1}^{p} x\left(\left\lfloor \frac{n}{N} \right\rfloor N + k - i - 1 - Nml\right). \quad (7)$$

Here $g_{p,i,k}(m_1, \ldots, m_p) = g_{p,i}(Nm_1+(i-1)+k, \ldots, Nm_p+(i-1)+k)$ and k is a nonnegative integer less than N. Since the output of the TIDAC is the sum of the outputs of the constituent DACs, Equation (7) can be rewritten as:

$$y\left(\left\lfloor \frac{n}{N} \right\rfloor N + k\right) = \sum_{l=1}^{N} y_i\left(\left\lfloor \frac{n}{N} \right\rfloor N + k\right) = \sum_{l=1}^{N} \sum_{p=2}^{P} \sum_{m_1=1}^{\left\lfloor \frac{M}{N} \right\rfloor} \ldots \quad (8)$$

$$\sum_{m_p=1}^{\left\lfloor \frac{M}{N} \right\rfloor} g_{p,i,k}(m_1, \ldots m_p) \prod_{l=1}^{p} \times \left(\left\lfloor \frac{n}{N} \right\rfloor N + k - (i-1) - Nm_l\right)$$

Under the assumption that the nonlinearity is weak (i.e., that NL(x+NL(x))≈NL(x)), Equation (8) provides a compensation term for the interleaved nonlinear response. (Weak nonlinearity is not a requirement, but is assumed here to simplify the analysis.)

Predistortion in TIDACs Versus Equalization in TIADCs

The polyphase nonlinear digital predistortion described herein is similar to the equalization for TIADCs described in U.S. application Ser. No. 12/963,128 to Goodman et al. Both predistortion and equalization compensate for nonlinearities in time-interleaved outputs due to mismatches between interleaved channels. There is, however, a significant difference between TIDACs and TIADCs that affects predistortion and equalization: each DAC in a TIDAC sees a decimated version of the digital input signal, whereas each ADC in the TIADC sees a fullband version of the analog input signal. As a result, the input of a constituent converter in a TIDAC includes aliased frequency components that are not present in the input to a constituent converter of a TIADC.

Figure 4:
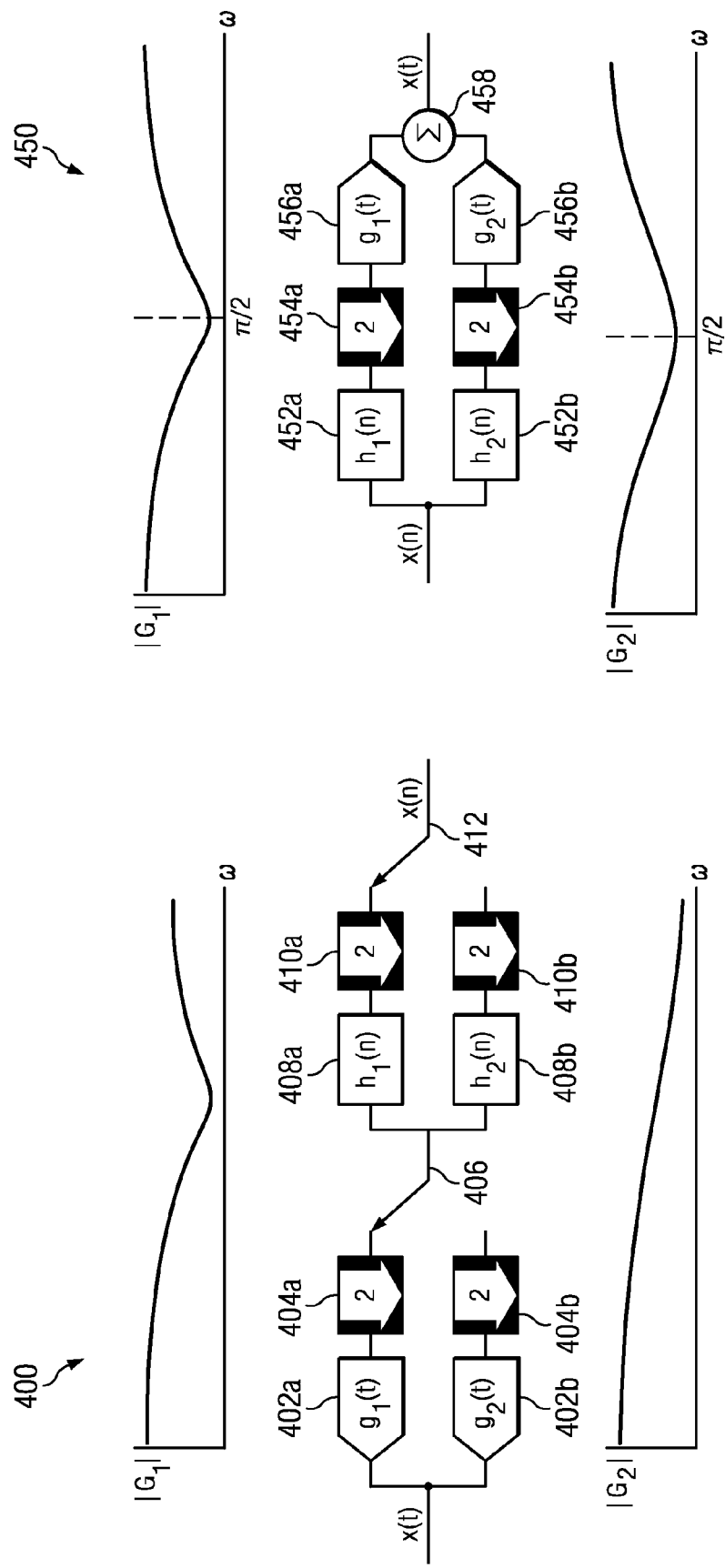
FIG. 4 is a diagram that illustrates differences between TIDACs and time-interleaved analog-to-digital converters (TIADCs).

FIG. 4 illustrates the differences between equalization in a two-channel TIADC 400 and predistortion in a two-channel TIDAC 450. The TIADC 400 includes a pair of ADCs 402a and 402b that operate on a full-bandwidth analog signal x(t) in a staggered fashion to produce respective half-rate digital outputs (as indicated by notional downsamplers 404a and 404b). A switch 406 couples the half-rate digital outputs to linear filters 408a and 408b that filter the interleaved, full-rate digital outputs and downsample the resulting waveforms. Another switch 412 interleaves the filter outputs, which are also half-rate digital signal (as indicated by notional downsamplers 410a and 410b), to produce a distortion-free full-rate digital output x(n).

The TIDAC 450 performs the inverse operation: linear filters 452a, 452b and downsamplers 454a, 454b filter and decimate a full-rate digital input x(n) to yield two half-rate digital signals. DACs 456a, 456b convert the half-rate digital signals into half-bandwidth analog signals, which are combined with a summer 458 to yield a full-bandwidth analog output x(t).

Plots above and below the TIADC 400 show the frequency responses $|G_1|$ and $|G_2|$ of the component ADCs 402a and 402b, respectively. Although each component ADC 402a, 402b emits a half-rate output, the frequency response of each component ADC 402a, 402b is applied to the entire input because each component ADC 402a, 402b receives the full-bandwidth input. In contrast, the frequency responses $|G_1|$ and $|G_2|$ (plotted above and below the TIDAC 450) of the component DACs 454a and 454b, respectively is only applied to half of the signal because the component DACs 454a, 454b receive half-rate inputs. Despite this difference, similar architectures can be used for equalization and predistortion as described above.

While this invention has been particularly shown and described with references to example embodiments thereof, it will be understood by those skilled in the art that various changes in form and details may be made therein without departing from the scope of the invention encompassed by the appended claims.

What is claimed is:

1. A method of predistorting a digital waveform, the method comprising:
   creating a polyphase nonlinear compensation term representative of a nonlinear response of at least one digital-to-analog converter (DAC) in a time-interleaved digital-to-analog converter (TIDAC) having a number (N) of DACs, wherein at least N−1 filters operate in parallel on the digital waveform, and wherein a switch interleaves outputs of the at least N−1 filters utilizing a processor; and
   obtaining a predistorted digital waveform by subtracting the polyphase nonlinear compensation term from a copy of the digital waveform utilizing a summer.

2. The method of claim 1 further comprising:
   generating an analog representation of the predistorted digital waveform with the TIDAC that is less distorted than an analog representation of the digital waveform generated by the TIDAC alone.

3. The method of claim 1 further comprising:
   measuring an output of the TIDAC to obtain a distortion measurement; and
   adjusting the polyphase nonlinear compensation term based on the distortion measurement.

4. The method of claim 1 wherein the nonlinear response is due to a gain, offset, or phase mismatch between at least one pair of DACs in the TIDAC.

5. The method of claim 1 wherein creating the polyphase nonlinear compensation term includes filtering copies of the digital waveform with linear filters and down-sampling and interleaving outputs of the linear filters.

6. The method of claim 1 wherein creating the polyphase nonlinear compensation term includes filtering copies of the digital waveform with linear filters and mixing an output of at least one of the linear filters with a tone.

7. The method of claim 1 wherein creating the polyphase nonlinear compensation term includes filtering copies of the digital waveform with polynomial filters and down-sampling and interleaving outputs of the polynomial filters.

8. The method of claim 1 wherein creating the polyphase nonlinear compensation term includes filtering copies of the digital waveform with polynomial filters and mixing an outputs of at least one of the polynomial filters with a tone.

9. The method of claim 1 further including:
   creating a linear mismatch compensation term representative of the linear mismatch between DACs in the TIDAC; and
   wherein obtaining the predistorted digital signal further includes subtracting the linear mismatch compensation term from the copy of the digital waveform.

10. The method of claim 1 wherein obtaining the predistorted digital signal further includes subtracting an offset from the copy of the digital waveform.

11. The method of claim 10 wherein subtracting an offset from the copy of the digital waveform includes subtracting a plurality of offsets from the copy of the digital waveform and wherein each offset corresponds to a different DAC in the TIDAC.

12. The method of claim 1 further including:
delaying the copy of the digital waveform by a time approximately equal to the time required to create the polyphase nonlinear compensation term before subtracting the polyphase nonlinear compensation term from the copy of the digital waveform.

13. An apparatus for predistorting a digital waveform, the apparatus comprising:
a processor configured to generate a polyphase nonlinear compensation term representative of a mismatch between a number (N) of digital-to-analog converters (DACs) in a time-interleaved digital-to-analog converter (TIDAC), wherein at least N−1 filters are configured to operate in parallel on the digital waveform, and wherein the processor includes a switch configured to interleave outputs of the at least N−1 filters; and
a summer operably coupled to the processor and configured to obtain a predistorted digital waveform by subtracting the polyphase nonlinear compensation term from a copy of the digital waveform.

14. The apparatus of claim 13 wherein the processor is further configured to adjust the polyphase nonlinear compensation term based on distortion measured in the analog representation of the predistorted digital waveform.

15. The apparatus of claim 13 wherein the nonlinear response is a gain, offset, or phase mismatch between at least one pair of DACs in the TIDAC.

16. The apparatus of claim 13 wherein the filters are linear filters.

17. The apparatus of claim 13 wherein the filters are polynomial filters.

18. The apparatus of claim 13 in combination with a TIDAC configured to generate an analog representation of the predistorted digital waveform that is less distorted than an analog representation of the digital waveform generated by the TIDAC alone.

19. The apparatus of claim 13 wherein the processor further includes a mixer configured to mix an output of at least one of the filters with a tone.

20. The apparatus of claim 13 wherein the processor is further configured to create a linear mismatch compensation term representative of the linear mismatch between DACs in the TIDAC, and wherein the summer is further configured to subtract the linear mismatch compensation term from the copy of the digital waveform.

21. The apparatus of claim 13 wherein the summer is further configured to subtract an offset from the copy of the digital waveform.

22. The apparatus of claim 21 wherein the summer is further configured to subtract a plurality of offsets from the copy of the digital waveform and wherein each offset corresponds to a different DAC in the TIDAC.

23. The apparatus of claim 13 further including:
a delay block configured to delay the copy of the digital waveform by a time approximately equal to the time required to create the polyphase nonlinear compensation term.

24. An apparatus for predistorting a digital waveform, the apparatus comprising:
means for creating a polyphase nonlinear compensation term representative of at least one of a nonlinear response of a digital-to-analog converter (DAC) and a mismatch between a number (N) of DACs in a time-interleaved digital-to-analog converter (TIDAC), wherein at least N−1 filters operate in parallel on the digital waveform, and wherein a switch interleaves outputs of the at least N−1 filters; and
means for obtaining a predistorted digital waveform by subtracting the polyphase nonlinear compensation term from a copy of the digital waveform.

* * * * *